United States Patent
Kasamsetty et al.

(10) Patent No.: US 9,111,645 B2
(45) Date of Patent: Aug. 18, 2015

(54) REQUEST-COMMAND ENCODING FOR REDUCED-DATA-RATE TESTING

(75) Inventors: Kishore Ven Kasamsetty, Cupertino, CA (US); Wayne S. Richardson, Saratoga, CA (US); Kurt Knorpp, San Carlos, CA (US); Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 532 days.

(21) Appl. No.: 13/000,280

(22) PCT Filed: Jul. 17, 2009

(86) PCT No.: PCT/US2009/051081
§ 371 (c)(1),
(2), (4) Date: Dec. 20, 2010

(87) PCT Pub. No.: WO2010/017015
PCT Pub. Date: Feb. 11, 2010

(65) Prior Publication Data
US 2011/0126081 A1 May 26, 2011

Related U.S. Application Data

(60) Provisional application No. 61/087,550, filed on Aug. 8, 2008.

(51) Int. Cl.
| | |
|---|---|
| *G11C 29/56* | (2006.01) |
| *G11C 29/16* | (2006.01) |
| *G11C 29/02* | (2006.01) |
| *G11C 29/12* | (2006.01) |
| *G11C 29/18* | (2006.01) |

(52) U.S. Cl.
CPC .............. *G11C 29/16* (2013.01); *G11C 29/028* (2013.01); *G11C 29/12015* (2013.01); *G11C 29/18* (2013.01); *G11C 29/56012* (2013.01)

(58) Field of Classification Search
CPC .................... G01R 31/31903; G11C 29/56012
USPC ........... 714/718–723, 763–768; 711/211, 212
See application file for complete search history.

(56) References Cited

U.S. PATENT DOCUMENTS 5,978,304 A * 11/1999 Crafts ...................... 365/230.03
6,003,142 A * 12/1999 Mori ............................. 714/30

(Continued)

FOREIGN PATENT DOCUMENTS

EP 0359551 A2 3/1990

OTHER PUBLICATIONS

PCI Express, "PCI Express Base Specification Revision 2.0," Dec. 20, 2006. 608 pages.

*Primary Examiner* — Steve Nguyen
(74) *Attorney, Agent, or Firm* — Lance Kreisman; Peninsula Patent Group (57) ABSTRACT

Embodiments of a memory device are described. This memory device includes a signal connector which is electrically coupled to a command/address (CA) link, and an interface circuit, which is electrically coupled to the signal connector, and which receives CA packets via the CA link. A given CA packet includes an address field having address information corresponding to one or more storage locations in the memory device. Moreover, the memory device includes control logic having two operating modes, where, during a first operating mode, the control logic decodes address information in the CA packets using full-field sampling, and, during the second operating mode, the control logic decodes a portion of the address information in the CA packets using sub-field sampling.

18 Claims, 8 Drawing Sheets

(56) References Cited

U.S. PATENT DOCUMENTS

| | | |
|---|---|---|
| 6,647,524 B1 | 11/2003 | Huang et al. |
| 6,728,931 B2 * | 4/2004 | Parris et al. ............ 714/814 |
| 6,845,460 B2 * | 1/2005 | Lee et al. ............ 713/401 |
| 6,898,139 B2 * | 5/2005 | Lee et al. ............ 365/221 |
| 7,020,806 B2 * | 3/2006 | Finteis ............ 714/42 |
| 7,426,583 B1 * | 9/2008 | Dutra et al. ............ 710/3 |
| 7,587,645 B2 * | 9/2009 | Chang et al. ............ 714/738 |
| 2002/0170003 A1 | 11/2002 | Hirabayashi |
| 2005/0063241 A1 | 3/2005 | Pereira et al. |
| 2007/0250283 A1 * | 10/2007 | Barnum et al. ............ 702/117 |

* cited by examiner

REQUEST-COMMAND ENCODING FOR REDUCED-DATA-RATE TESTING

TECHNICAL FIELD

The present embodiments relate to memory components. More specifically, the present embodiments relate to memory devices and/or memory controllers that support communication of command/address information at a reduced data rate.

BACKGROUND

During reduced-data-rate (RDR) testing, a memory device, such as dynamic random-access memory (DRAM), is tested using low-speed test equipment. In particular, the data rate on a data (DQ) channel is reduced by repeating data bits in successive temporal bit positions. Then, a multiple pass test is performed using bit transitions in different bit positions during successive passes. This technique enables a full-interface test to be performed using low-speed test equipment.

Moreover, the ability to perform part or all of the production testing of the memory device using low-speed test equipment can facilitate high-volume, low-cost manufacturing. For example, many manufacturers have invested in test equipment that includes commodity memory interfaces, such as double data rate (DDR), and a low-speed test capability allows these manufacturers to leverage their existing test equipment.

RDR techniques typically rely on the ability to issue request commands during the low-speed testing. This is possible for many memory architectures, such as extreme data rate (XDR), because the command/address (CA) channel has a lower data rate than the DQ channel (for example, for XDR, the CA channel is 4-8× slower than the DQ channel). Consequently, when the data rate on the DQ channel is reduced, the CA channel continues to function properly.

However, many high-throughput memory architectures, such as XDR2 and the terabyte bandwidth initiative (TBI), use a high-speed fully differential CA channel that runs at the same speed as the DQ channel. Unfortunately, if RDR testing is performed on the CA channel in these high-throughput memory architectures, an invalid CA command will occur. Thus, RDR testing is currently not available for many high-throughput memory architectures.

Hence, there is a need for a device that supports communication of CA information during RDR testing without the above-described problems.

BRIEF DESCRIPTION OF THE FIGURES

Note that like reference numerals refer to corresponding parts throughout the drawings.

DETAILED DESCRIPTION

Figure 1:
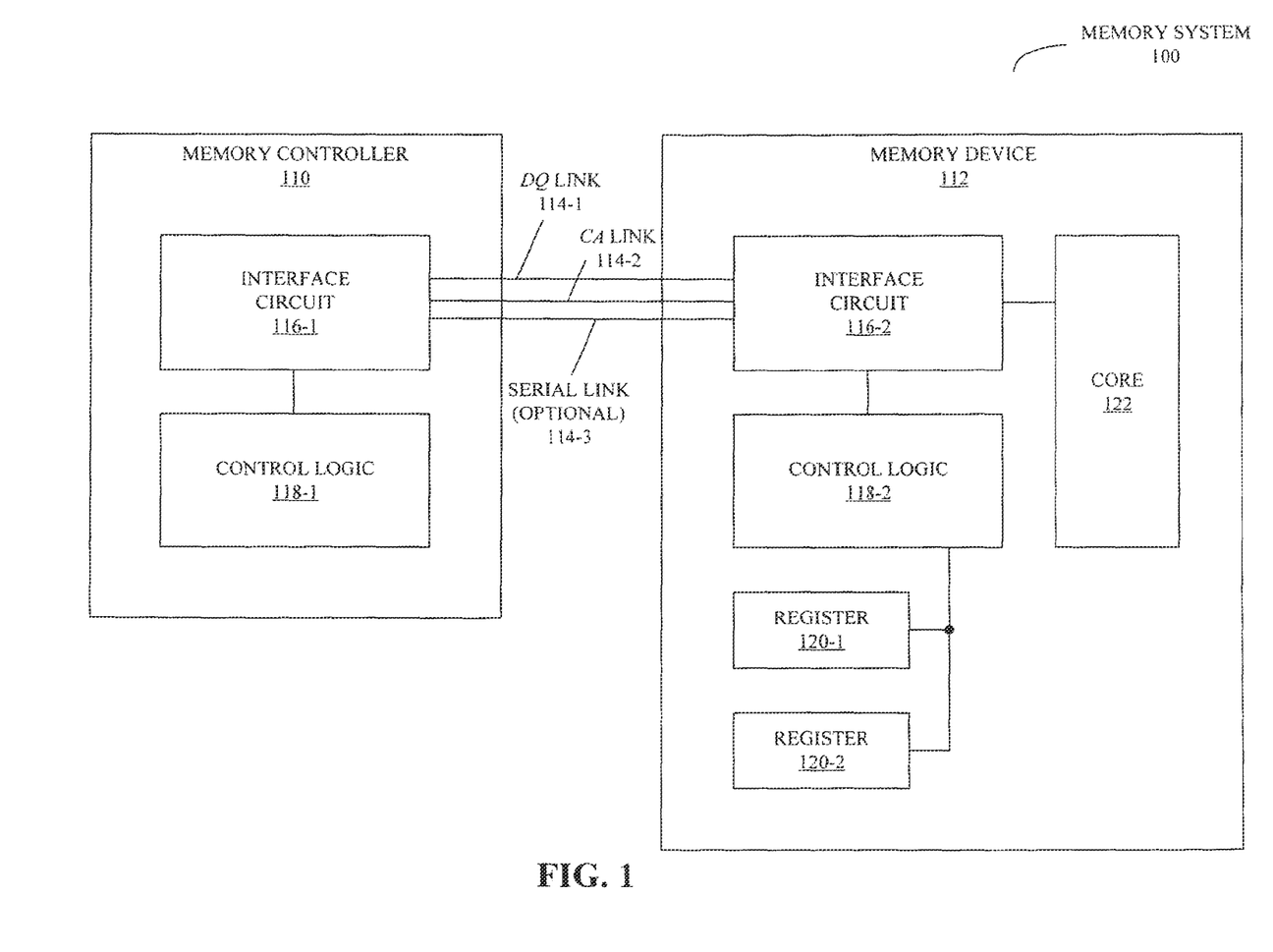
FIG. 1 is a block diagram illustrating an embodiment of a memory system.

FIG. 1 presents a block diagram illustrating an embodiment of a memory system 100. In this memory system, control logic 118-1 in memory controller 110 provides instructions, for example, in a command/address (CA) packet, which select an operating mode of memory device 112 (and, in particular, an operation of control logic 118-2). During a first operating mode (henceforth referred to as a 'normal' operating mode), memory controller 110 communicates data (DQ) packets and CA packets to memory device 112 via interfaces 116 and DQ link 114-1 and CA link 114-2, respectively, at associated data rate(s) (which may be the same as or different than each other). Moreover, control logic 118-2 decodes data in the data packets and/or address information in the CA packets using full-field sampling, in which all bits are decoded.

During the RDR operating mode, memory controller 110 also communicates data (DQ) packets and CA packets to memory device 112 via interfaces 116 and DQ link 114-1 and CA link 114-2, respectively, at associated data rate(s) (which may be the same as or different than each other). However, the effective date rate(s) during the RDR operating mode may be less than the data rate(s) during the normal operating mode. In particular, control logic 118-2 may decode data in the data packets and/or address information in request commands in the CA packets using sub-field sampling, in which a subset of bits are decoded, such as every other address bit or every fourth address bit (which will, respectively, reduce the effective data rate by 50-75% relative to the normal operating mode).

For example, control logic 118-2 may repeat the values of one or more successive address bits in a given CA packet during the RDR operating mode, which may ensure that the CA-packet definition remains valid even at a reduced data rate. While the subset of address bits may not correspond to the full address space associated with core 122, the portion of the storage locations in core 122 that correspond to this subset may be large enough to enable testing, initialization and/or calibration of memory device 112 and/or memory system 100. Thus, the RDR operating mode may facilitate RDR testing using low-speed test equipment on a CA channel (which includes interfaces 116 and CA link 114-2), as well as on a DQ channel (which includes interfaces 116 and DQ link 114-1), even in high-throughput memory architectures. Moreover, by ensuring that the CA channel is reliable, even at a reduced data rate, the RDR operating mode may allow: independent calibration of communication via the CA channel and the DQ channel; determination of jitter on the CA channel and determination of jitter on the DQ channel; and/or isolation of problems associated with the CA channel versus problems associated with the DQ channel.

These integrated circuits and techniques may be used in a wide variety of systems, such as a wide variety of memory systems and memory devices, including: volatile memory, non-volatile memory, DRAM, static random-access memory (SRAM), read-only memory (ROM), erasable programmable read-only memory (EPROM), electrically erasable programmable read-only memory (EEPROM), NOR flash, NAND flash, solid-state memory, and/or other types of memory. Moreover, for a given type of memory, these techniques may be used in different memory technologies or technology generations (which may use different power supply voltages or signaling rates). For example, these techniques may be used in extreme data rate (XDR), double-data rate (DDR), graphics double-data rate (GDDR) and/or synchronous DRAM, such as: DDR2, DDR3, DDRx, GDDR1, GDDR3, GDDR5, and/or mobile DDR.

Additionally, integrated circuits and/or memory components (such as a memory controller, a memory device, a memory module, and/or a memory system) that use these techniques may be included in a wide variety of applications, such as: desktop or laptop computers, computer systems, hand-held or portable devices (e.g., personal digital assistants and/or cellular telephones), set-top boxes, home networks, and/or video-game devices. For example, a storage device (such as the memory module) may be included in computer main memory. Moreover, one or more of these embodiments may be included in a communication channel, such as: serial or parallel links, metropolitan area networks (MANs), local area networks (LANs), and/or personal area networks (PANs).

We now further describe embodiments of request-command encoding for RDR testing. Continuing the discussion of FIG. 1, in some embodiments memory device 112 includes a register 120-1 that stores information which specifies a current operating mode of control logic 118-2. For example, the instructions provided by control logic 118-1 in memory controller 110 may include a value that is stored in register 120-1, and which specifies the current operating mode of control logic 118-2 (and, thus, memory device 112).

While register 120-1 is used as an illustration in memory system 100, in other embodiments a variety of techniques may be used, including: a fuse, whose state (open or closed) indicates the current operating mode; a connector that receives a voltage (such as high or low) that indicates the current operating mode; and/or a node electrically coupled to an optional initialization bus (not shown), which receives information that specifies the current operating mode. Other techniques for specifying the current operating mode will also occur to those having familiarity with systems logic design.

During the RDR operating mode, it may be useful if the full range of storage locations in core 122 is available. In some embodiments, this is achieved by storing a remainder of the address bits (which are ignored during the sub-field decoding) in register 120-2. Note that a combination of the subset of the address bits and the remainder of the address bits may encompass a full set of address bits.

In some embodiments, the remainder of the address bits are stored in register 120-2 prior to and/or at a start of the RDR operating mode. For example, the remainder of the address bits may be communicated to memory device 112 using optional serial link 114-3. This serial link 114-3 may have a signaling rate (as well as a data rate) that is lower than a signaling rate associated with CA link 114-2 in either operating mode.

Memory system 100 may include fewer components or additional components. Moreover, two or more components may be combined into a single component and/or the position of one or more components may be changed.

Components and/or functionality illustrated in these embodiments may be implemented using analog circuits and/or digital circuits. Furthermore, the components and/or the functionality may be implemented using hardware and/or software. For example, memory controller 110 may be included in a processor or a processor core.

Figure 2A:
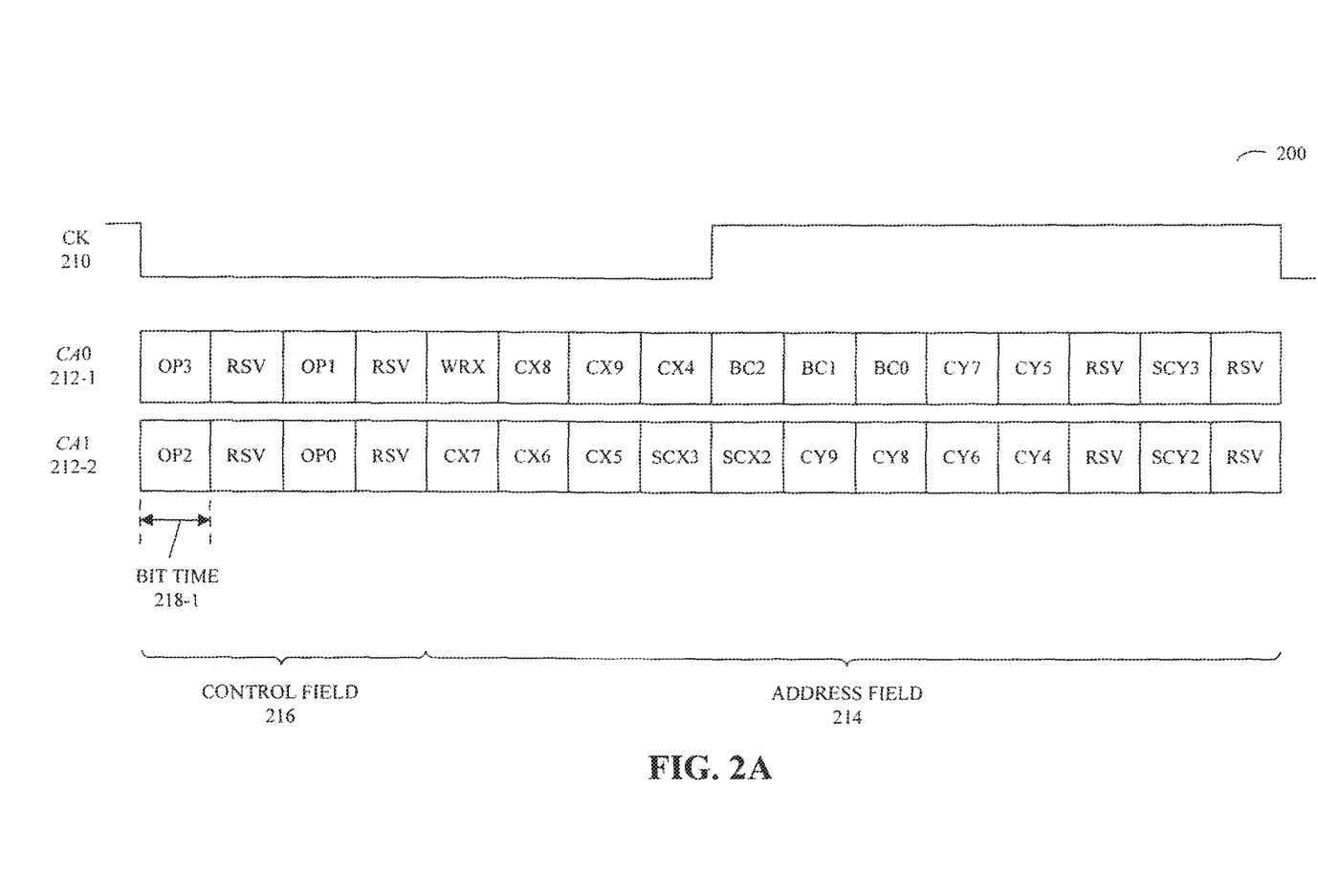
FIG. 2A is a drawing illustrating an embodiment of command/address (CA) packets.

We now describe embodiments of CA packets. FIG. 2A presents a drawing 200 illustrating an embodiment of CA packets CA0 212-1 and CA1 212-2. These CA packets may convey information associated with a request command during a period of clock (CK) 210. Note that each of CA packets 212 may have multiple bit locations or bit times, such as bit time 218-1. Moreover, a given CA packet may include an address field 214 (which includes address bits corresponding to one or more storage locations in core 122 in FIG. 1) and control field 216 (which includes information associated with processing of the given CA packet in memory device 112 in FIG. 1). In some embodiments, the information in the control field 216 is referred to as 'opcode'.

Figure 2B:
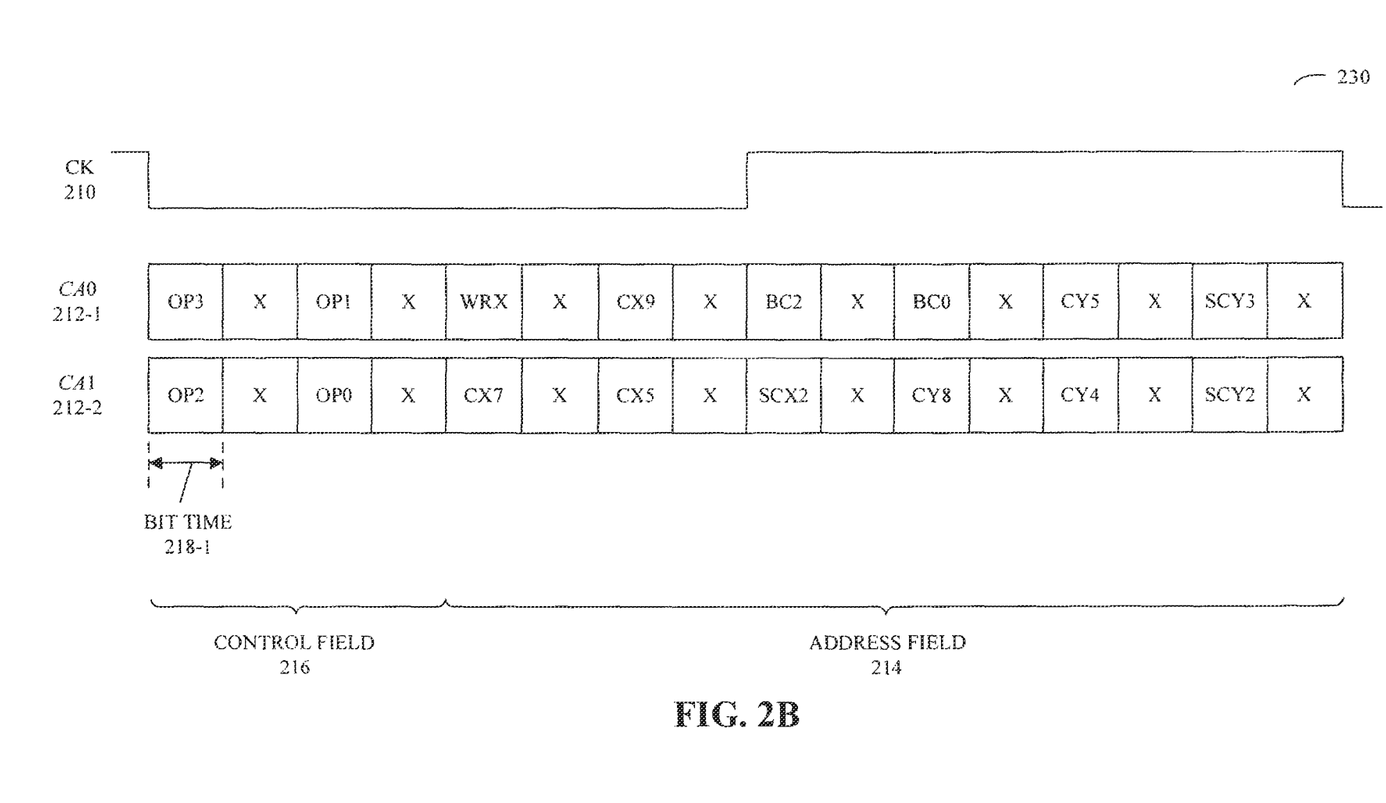
FIG. 2B is a drawing illustrating an embodiment of CA packets.

As illustrated in FIG. 2A, during the normal operating mode a subset of the control field 216 may be reserved. Moreover, as illustrated in FIG. 2B, which presents a drawing 230 illustrating an embodiment of CA packets CA0 212-1 and CA1 212-2, during the RDR operating mode, these reserved bits may be ignored by control logic 118-2 (FIG. 1) (as indicated by the symbol 'X'). Note that the use of reserved bit locations or bit times in the control field 216 may allow these portions of the given CA packet to be correctly decoded in either operating mode without modifying control logic 118-2 (FIG. 1) because, in these embodiments, all of the opcode bits are decoded.

Furthermore, during the normal operating mode, control logic 118-2 (FIG. 1) may decode all of the address bits in address field 214 (thus, there may not be reserved bit locations or bit times in the address field 214). However, during the RDR operating mode, a subset of the address bits in the given CA packet may be decoded. For example, the subset of the address bits may include every other address bit (as illustrated in FIG. 2B) or every fourth address bit.

Figure 2C:
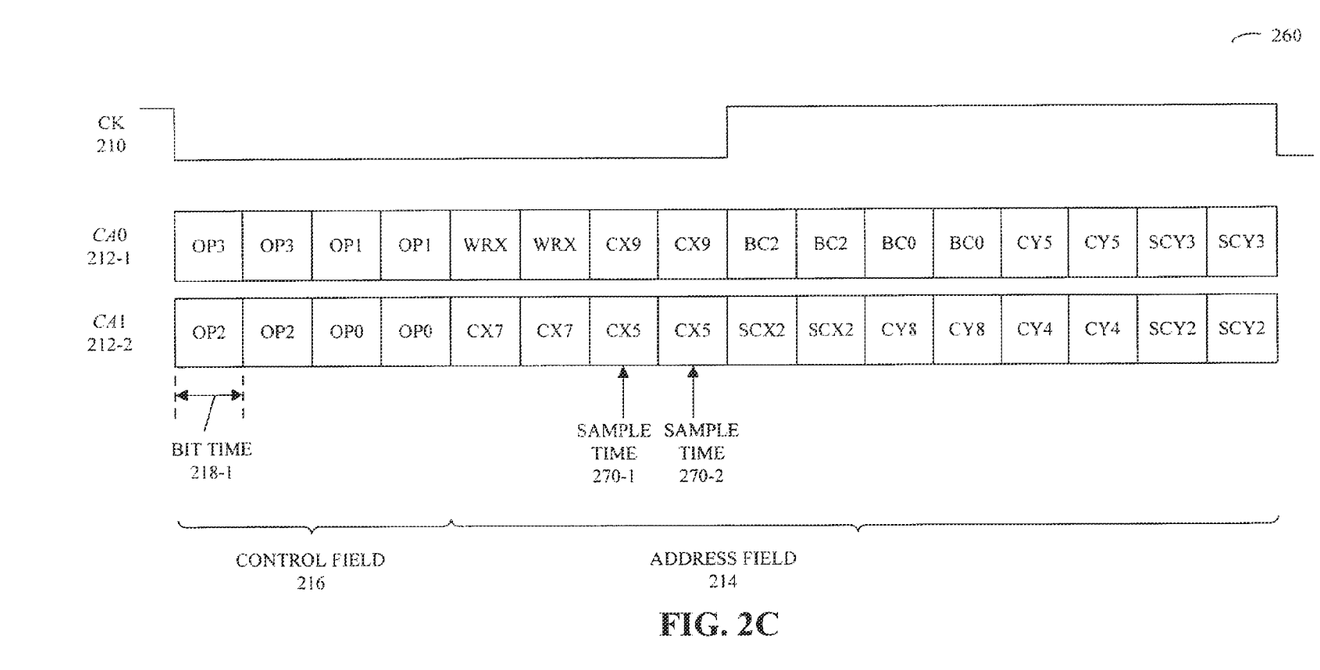
FIG. 2C is a drawing illustrating an embodiment of CA packets.

As noted previously, values in one or more successive bit locations or bit times may be repeated during the RDR operating mode. This is shown in FIG. 2C, which presents a drawing 260 illustrating an embodiment of CA packets CA0 212-1 and CA1 212-2, during the RDR operating mode. In this embodiment, opcode and address bits are repeated in successive bit times 218. A receiver in interface circuit 116-2 (FIG. 1) may receive either of the repeated instances (for example, by sampling at sample time 270-1 or sample time 270-2), thereby operating at a reduced data rate. In some embodiments, communication between memory controller 110 (FIG. 1) and memory device 112 (FIG. 1) is calibrated, for example, in a calibration mode (which is described further below with reference to FIG. 3).

Figure 2D:
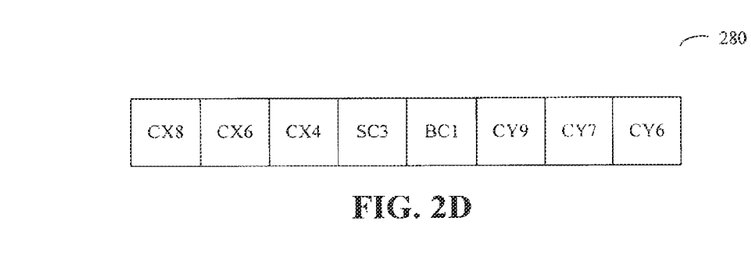
FIG. 2D is a drawing illustrating an embodiment of a register.

However, the RDR techniques illustrated in FIGS. 2B and 2C may restrict the addressable portion of the full address space during the RDR operating mode because only a portion of the address bits are decoded. For example, if every other address bit is ignored, addresses for half of the storage locations in core 122 (FIG. 1) may not be accessible. However, this portion of the full address space may be accessed by combining the address bits in the address field 214 of CA packets 212 with a remainder of the address bits, which may be stored in register 120-2 (FIG. 1). For example, values of the remainder of the address bits may be statistically encoded and stored in register 120-2 (FIG. 1), thereby allowing (on a statistical basis) the full address space to be accessed during: RDR testing, initialization and/or calibration. FIG. 2D presents a drawing 280 illustrating an embodiment of a register which stores the remainder of the address bits.

In an exemplary embodiment, a given one of CA packets 212 (FIGS. 2A and 2B) includes 16 bits. These bits may include at least four opcode bits in control field 216 (FIGS. 2A and 2B), four reserve bits (adjacent to the opcode bits) in control field 216 (FIGS. 2A and 2B), and eight address bits in address field 214. During the RDR operating mode, the four opcode bits and four of the eight address bits in each of the CA packets 212 (FIGS. 2A and 2B) may be decoded. Thus, in this example, 16 bits may be reduced to eight bits, i.e., the data rate for the CA packets may be reduced by 50%.

In other embodiments, there may be additional reserve bits between opcode bits in the control field 216 (FIGS. 2A and 2B) to facilitate data rate(s) during the RDR operating mode that are less than 50% of the data rate during the normal operating mode.

Figure 3:
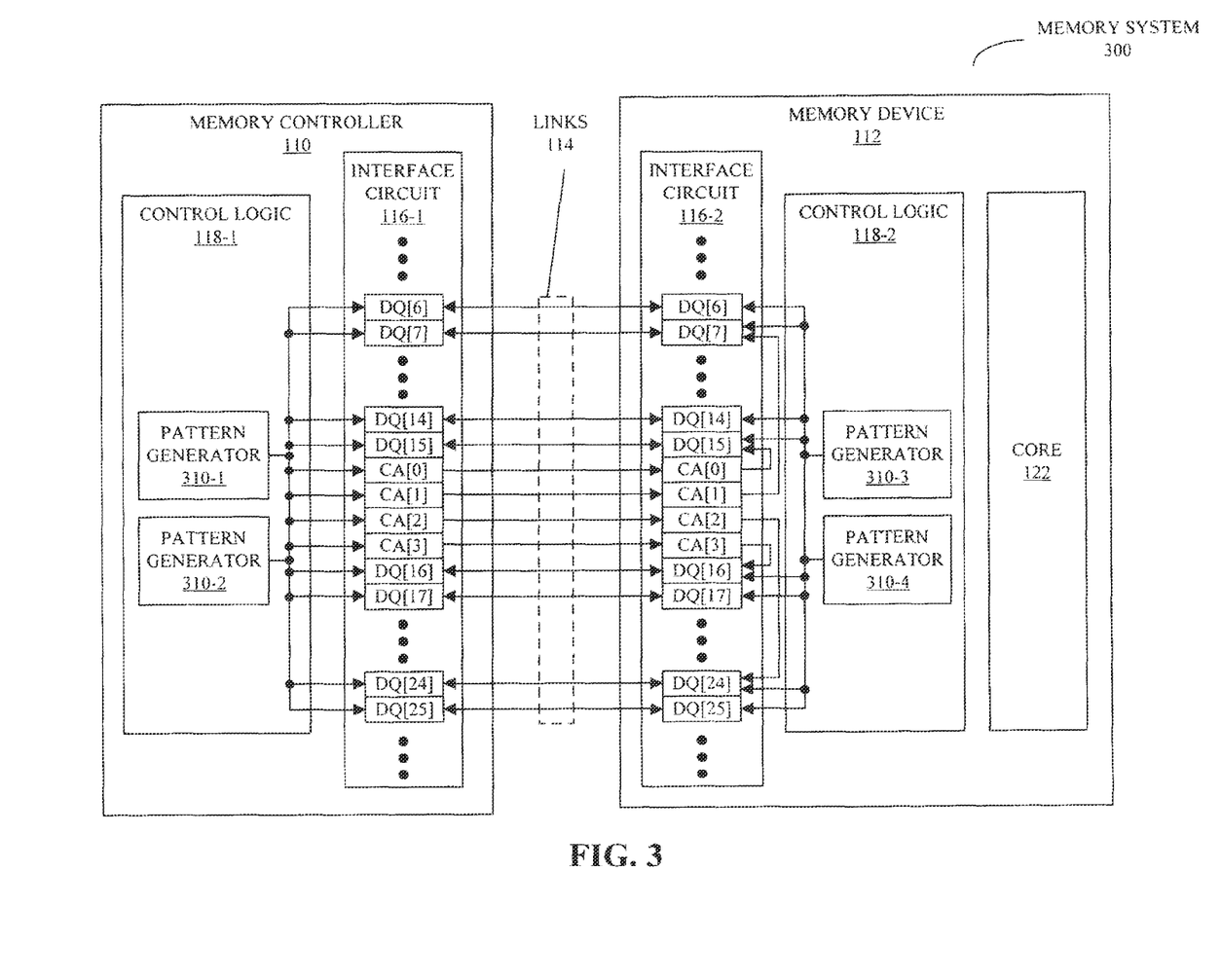
FIG. 3 is a block diagram illustrating an embodiment of a memory system.

As noted previously, in some embodiments, communication on links 114 may be calibrated during a calibration mode. For example, receiver phases in interface circuits 116 (FIG. 1) may be calibrated for the normal operating mode and the RDR operating mode. This may be accomplished by defining loopback paths between memory controller 110 (FIG. 1) and memory device 112 (FIG. 1) during the calibration mode. This is shown in FIG. 3, which presents a block diagram illustrating an embodiment of a memory system 300.

In memory system 300, interface circuits associated with pairs of data links, such as DQ[6] and DQ[7], are coupled in memory controller 110 and memory device 112. Note that the coupling of the interface circuits associated with the pairs of data (DQ) links in memory device 112 provides loopback paths. Then, using pseudo-random sequences provided by pattern generators 310-1 and 310-3 can be used to calibrate these DQ communication channels, for example, receiver phases may be calibrated. In general, the calibration during the calibration mode may include: timing (or phase), impedance and/or voltage calibration of at least some of the links 114. Note that calibration may be performed: when memory controller 110-1 is initialized, after the initialization during the calibration mode, and/or during operation of the memory system 300.

Similarly, the interface circuits associated with command links may be calibrated by looping the command links back through the data links. In order to support the reduced data rates during the RDR operating mode, these CA communication channels (as well as the DQ communication channels) may be calibrated at the normal data rate and at one or more fractional data rates. For example, additional pseudo-random sequences may be provided by pattern generators 310-2 and 310-4. Alternatively, pattern generators 310-1 and 310-3 may be able to provide pseudo-random sequences corresponding to the data rates used in the normal operating mode and the RDR operating mode.

Memory system 300 may include fewer components or additional components. Moreover, two or more components may be combined into a single component and/or the position of one or more components may be changed.

Figure 4A:
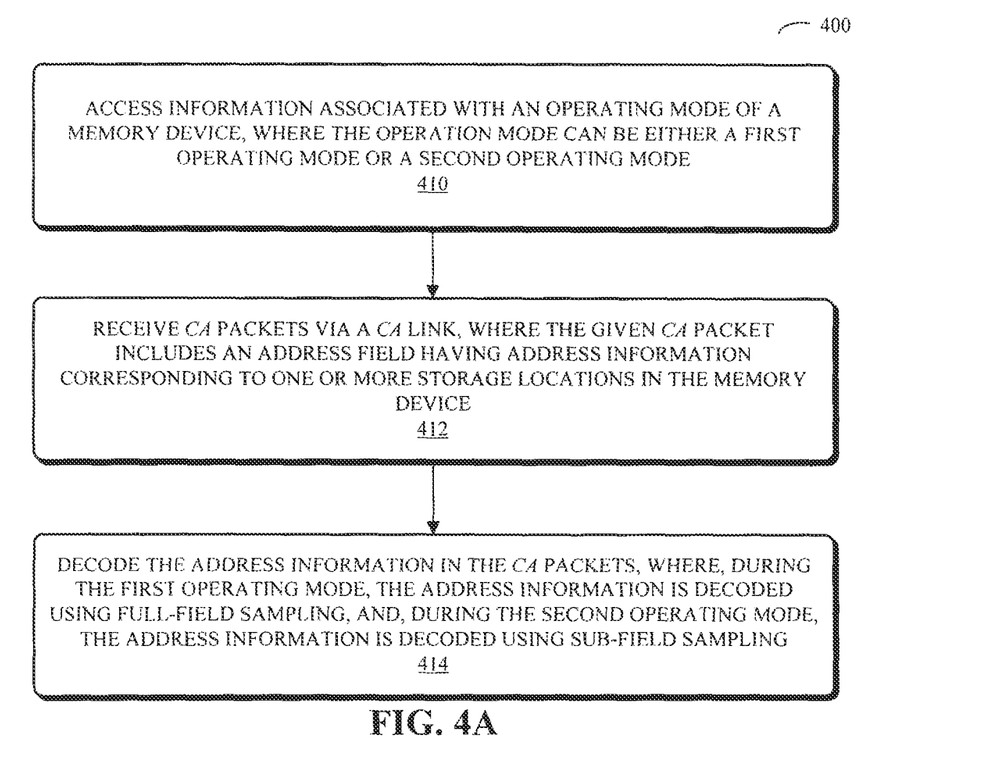
FIG. 4A is a flow chart illustrating an embodiment of a process for interpreting address information received by a memory device.

We now describe embodiments of a process for interpreting address information received by a memory device. FIG. 4A presents a flow chart 400 illustrating an embodiment of a process for interpreting address information received by a memory device. During this process, information associated with an operating mode of the memory device is accessed (410), where the operating mode can be either a first operating mode or a second operating mode. Then, CA packets are received via the CA link (412), where the given CA packet includes the address field having address information corresponding to one or more storage locations in the memory device. Next, the address information in the CA packets is decoded (414), where, during the first operating mode, the address information is decoded using full-field sampling, and, during the second operating mode, the address information is decoded using sub-field sampling.

Figure 4B:
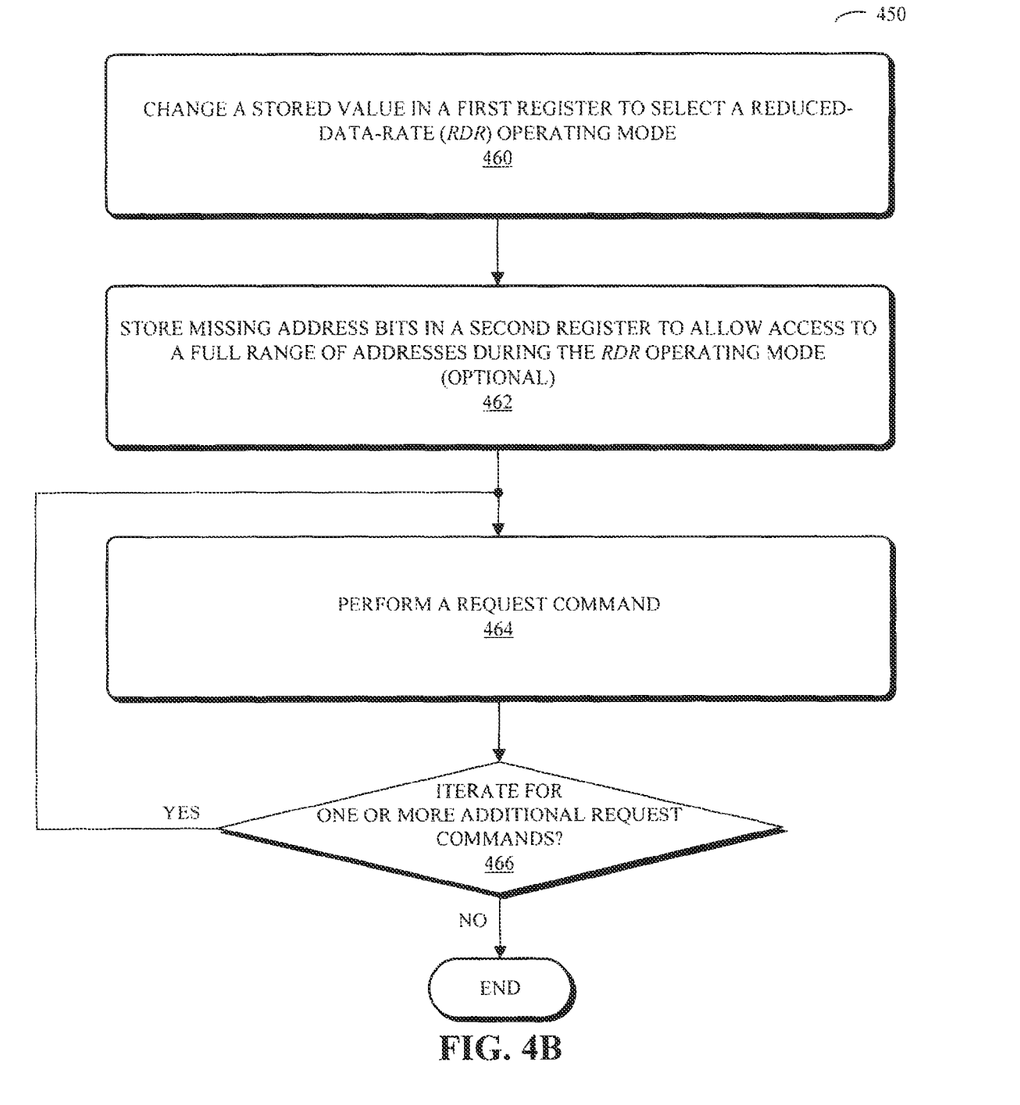
FIG. 4B is a flow chart illustrating an embodiment of a process for performing RDR testing.

FIG. 4B presents a flow chart illustrating an embodiment of a process 450 for performing RDR testing. During this process, a value stored in a first register is changed to select an RDR operating mode (460). Then, missing address bits are optionally stored in a second register to allow access to a full range of addresses during the RDR operating mode (462). Next, a request command is performed (464). This operation may be iterated for one or more additional request commands (466), such as request commands in a sequence of request commands.

In some embodiments of processes 400 (FIG. 4A) and 450 there are fewer or additional operations. Moreover, two or more operations may be combined into a single operation and/or a position of one or more operations may be changed.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 5:
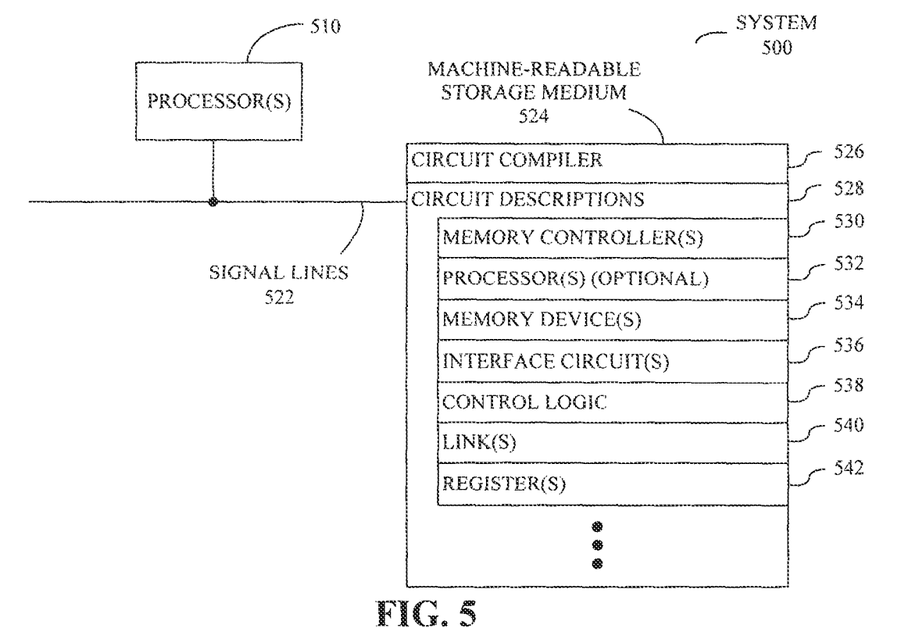
FIG. 5 is a block diagram illustrating an embodiment of a system.

FIG. 5 presents a block diagram illustrating an embodiment of a system 500 that stores such computer-readable files. This system may include at least one data processor or central processing unit (CPU) 510, machine-readable storage medium 524 and one or more signal lines or communication buses 522 for coupling these components to one another. Machine-readable storage medium 524 may include high-speed random access memory and/or non-volatile memory, such as: ROM, RAM, EPROM, EEPROM, flash, one or more smart cards, one or more magnetic disc storage devices, and/or one or more optical storage devices.

Machine-readable storage medium 524 may store a circuit compiler 526 and circuit descriptions 528. Circuit descriptions 528 may include descriptions of the circuits, or a subset of the circuits discussed above with respect to FIG. 1. In particular, circuit descriptions 528 may include circuit descriptions of: one or more memory controllers 530, optional processors 532, one or more memory devices 534, one or more interface circuits 536, control logic 538, one or more links 540, and/or one or more registers 542.

In some embodiments, system 500 includes fewer or additional components. Moreover, two or more components may be combined into a single component and/or a position of one or more components may be changed.

In some embodiments, a memory device includes a signal connector which is electrically coupled to a command/address (CA) link, and an interface circuit, which is electrically coupled to the signal connector, and which receives CA packets via the CA link. A given CA packet includes an address field having address information corresponding to one or more storage locations in the memory device. Moreover, the memory device includes control logic having two operating modes, where, during a first operating mode, the control logic decodes address information in the CA packets using full-field sampling, and, during the second operating mode, the control logic decodes a portion of the address information in the CA packets using sub-field sampling.

In some embodiments, the given CA packet includes a control field with information associated with processing of the given CA packet in the memory device. Moreover, the control logic considers a subset of the control field as reserved during the first operating mode, and the control logic ignores the subset of the control field during the second operating mode.

In some embodiments, the address information includes address bits, and during the first operating mode, all of the address bits in the given CA packet are decoded. However, during the second operating mode, a subset of the address bits in the given CA packet may be decoded. For example, the subset of the address bits may include every other address bit or every fourth address bit. Note that the subset of the address bits may facilitate access to a portion of the storage locations in the memory device during the second operating mode.

In some embodiments, the memory device includes a second signal connector, which is electrically coupled to a data (DQ) link, where the interface circuit is electrically coupled to the second signal connector, and where the interface circuit receives data packets via the DQ link. Moreover, the subset of the address bits facilitates calibration of communication via the DQ link during the second operating mode.

For example, CA packets may be communicated at a lower data rate during the second operating mode than in the first operating mode, which may facilitate independent calibration of communication via the CA link and the DQ link. Alternatively or additionally, the lower data rate during the second operating mode may facilitate determination of jitter associated with communication via the CA link and jitter associated with communication via the DQ link.

In some embodiments, the memory device includes a register that stores a remainder of the address bits. Note that a combination of the subset of the address bits and the remainder of the address bits may encompass a full set of address bits. Moreover, using the remainder of the address bits in addition to the subset of the address bits may facilitate access to a full range of the storage locations in the memory device during the second operating mode.

In some embodiments, the memory device includes a third signal connector which is electrically coupled to another link, where the interface circuit is electrically coupled to the third signal connector, and where the interface circuit receives the remainder of the address bits via the other link. Moreover, the control logic may store the remainder of the address bits in the register. For example, the other link may include a serial link having a signaling rate which is lower than a signaling rate associated with the CA link.

In some embodiments, the memory device includes another register that stores information which specifies a given operating mode of the control logic, which can be either the first operating mode or the second operating mode.

In some embodiments, the CA packets are communicated at a lower data rate during the second operating mode than in the first operating mode, which facilitates reduced-data-rate testing of the memory device.

In some embodiments, the memory device is disposed on an integrated circuit.

Another embodiment provides a memory controller. This memory controller includes a signal connector which is electrically coupled to the CA link, and an interface circuit which is electrically coupled to the signal connector. This interface circuit provides CA packets via the CA link to the memory device, where the given CA packet includes the address field having address information corresponding to one or more storage locations in the memory device. Moreover, the memory controller includes control logic that specifies an operating mode of the memory device using a CA packet, where the operating mode can be either the first operating mode or the second operating mode. During the first operating mode, the memory device decodes address information in the CA packets using full-field sampling, and, during the second operating mode, the memory device decodes the portion of the address information in the CA packets using sub-field sampling.

Another embodiment provides a memory system that includes the memory device, the CA link (which is electrically coupled to the memory device), and the memory controller (which is electrically coupled to the communication path).

Another embodiment provides a method for interpreting address information received by a memory device. During this method, information associated with an operating mode of the memory device is accessed, where the operating mode can be either a first operating mode or a second operating mode. Then, CA packets are received via the CA link, where the given CA packet includes the address field having address information corresponding to one or more storage locations in the memory device. Next, the address information in the CA packets is decoded, where, during the first operating mode, the address information is decoded using full-field sampling, and, during the second operating mode, the address information is decoded using sub-field sampling.

The preceding description has been presented to enable any person skilled in the art to make and use the disclosed embodiments, and was provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

Moreover, the foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A memory device, comprising:
a signal connector to electrically couple to a command/address (CA) link;
an interface circuit, electrically coupled to the signal connector, to receive CA packets via the CA link, each CA packet including N CA bits, where N is an integer greater than 1;
a receiver having two operating modes, wherein, during a first operating mode, the receiver samples each of the N CA bits at respective sample times using full-field sampling, at a first sampling rate, and, during the second operating mode, the receiver samples only a subset of the N bits at selected sample times using sub-field sampling, at a second sampling rate that is less than the first sampling rate; and
storage having storage cells that, in the first operating mode, are accessed via an address defined by the sampled N CA bits, and in the second operating mode, are accessed via a portion of a partial address defined by the subset of the N CA bits.

2. The memory device of claim 1, wherein a given CA packet includes address bits; and
wherein, during the first operating mode, all of the address bits in the given CA packet are sampled to generate the address.

3. The memory device of claim 1, wherein the given CA packet includes a control field with information associated with processing of the given CA packet in the memory device;
wherein the receiver includes control logic that considers a subset of the control field as reserved during the first operating mode; and
wherein the control logic ignores the subset of the control field during the second operating mode.

4. The memory device of claim 1, wherein a given CA packet includes address bits; and
wherein, during the second operating mode, only a subset of the address bits in the given CA packet are sampled to generate the partial address.

5. The memory device of claim 4, wherein the subset of the address bits includes every other address bit.

6. The memory device of claim 4, wherein the subset of the address bits includes every fourth address bit.

7. The memory device of claim 1, further comprising a second signal connector to electrically couple to a data (DQ) link, wherein the interface circuit is electrically coupled to the second signal connector;
wherein the interface circuit is to receive data packets via the DQ link; and
wherein the subset of the address bits facilitates calibration of communication via the DQ link during the second operating mode.

8. The memory device of claim 7, wherein CA packets are communicated at a lower data rate during the second operating mode than in the first operating mode.

9. The memory device of claim 1, further comprising a register to store information that specifies a given operating mode of the receiver, wherein the given operating mode can be either the first operating mode or the second operating mode.

10. The memory device of claim 1, wherein the CA packets are communicated at a lower data rate during the second operating mode than in the first operating mode, which facilitates reduced-data-rate testing of the memory device.

11. The memory device of claim 1, wherein the memory device is disposed on an integrated circuit.

12. A memory device, comprising:
a signal connector to electrically couple to a command/address (CA) link;
an interface circuit, electrically coupled to the signal connector, to receive CA packets via the CA link, each CA packet including N address bits, where N is an integer greater than 1;
a receiver having two operating modes, wherein, during a first operating mode, the receiver samples each of the N address bits at respective sample times using full-field sampling, at a first sampling rate, and, during the second operating mode, the receiver samples only a subset of the N address bits at selected sample times using sub-field sampling, at a second sampling rate that is less than the first sampling rate; and
a register to, for the second operating mode, store a remainder of the N address bits, wherein a combination of the subset of the address bits and the remainder of the address bits encompass a full set of the N address bits.

13. The memory device of claim 12, wherein using the remainder of the address bits in addition to the subset of the address bits facilitates access to a full range of the storage locations in the memory device during the second operating mode.

14. The memory device of claim 12, further comprising a second signal connector to electrically couple to a second link, wherein the interface circuit is electrically coupled to the second signal connector;
wherein the interface circuit is to receive the remainder of the address bits via the second link; and
wherein the control logic is to store the remainder of the address bits in the register.

15. The memory device of claim 14, wherein the second link includes a serial link having a signaling rate which is lower than a signaling rate associated with the CA link.

16. A memory controller, comprising:
a signal connector to electrically couple to a command/address (CA) link;
an interface circuit, electrically coupled to the signal connector, to provide CA packets via the CA link to a memory device having a receiver and storage, each CA packet including N CA bits, where N is an integer greater than 1; and
control logic to specify an operating mode of the memory device using a CA packet, wherein the operating mode can be either a first operating mode or a second operating mode;
wherein, during the first operating mode, the receiver is to sample each of the N CA bits at respective sample times using full-field sampling at a first sampling rate, and, during the second operating mode, the receiver is to sample only a subset of the N CA bits at selected sample times using sub-field sampling at a second sampling rate that is less than the first sampling rate; and
wherein the storage, in the first operating mode, is accessed via an address defined by the sampled CA bits, and in the second operating mode, is accessed via a partial address defined by the subset of the N CA bits.

17. A memory device, comprising:
a signal connector electrically coupled to a command/address (CA) link;
storage including storage locations;
an interface circuit, electrically coupled to the signal connector, to receive CA packets from a memory controller via the CA link, wherein a given CA packet includes an address field having N address bits corresponding to one or more of the storage locations in the memory device, where N is an integer greater than 1;
a receiver having two operating modes, wherein, during a first operating mode, the receiver samples each of the N address bits in the CA packets at respective sample times using full-field sampling at a first sampling rate, and, during the second operating mode, the receiver only samples a subset of the N address bits including every other address bit of the address bits at selected sample times at a second sampling rate that is less than the first sampling rate; and
wherein in the first operating mode, the storage locations are accessed via an address defined by the sampled N address bits, and in the second operating mode, are accessed via a partial address defined by the subset of the N address bits.

18. A method for interpreting address information received by a memory device, comprising:
- accessing information associated with an operating mode of the memory device, wherein the operating mode can be either a first operating mode or a second operating mode;
- receiving command/address (CA) packets via a CA link, each CA packet including N CA bits, where N is an integer greater than 1;
- sampling the CA bits, wherein, during the first operating mode, the sampling is carried out by sampling each of the N CA bits at respective sample times using full-field sampling at a first sampling rate, and, during the second operating mode, the sampling is carried out by sampling only a subset of the N CA bits at selected sample times using sub-field sampling at a second sampling rate that is less than the first sampling rate; and
- accessing storage based on the received CA packets, wherein the storage, in the first operating mode, is accessed via an address defined by the sampled N CA bits, and in the second operating mode, is accessed via a partial address defined by the subset of the N CA bits.

* * * * *